United States Patent

[11] 3,622,845

[72] Inventors James E. McIntyre
Crum Lynne;
Dante E. Piccone, Philadelphia; Istvan Somos, Landsdowne, all of Pa.

[21] Appl. No. 820,959
[22] Filed May 1, 1969
[45] Patented Nov. 23, 1971
[73] Assignee General Electric Company

[54] SCR WITH AMPLIFIED EMITTER GATE
6 Claims, 6 Drawing Figs.

[52] U.S. Cl. .......... 317/235 R, 317/234 N, 317/235 N, 317/235 AB, 317/235 AJ
[51] Int. Cl. .......... H01l 11/10, H01l 15/06
[50] Field of Search .......... 317/235 AB

[56] References Cited

UNITED STATES PATENTS

| | | | |
|---|---|---|---|
| 3,408,545 | 10/1968 | De Cecco et al. | 317/235 |
| 3,428,874 | 2/1969 | Gerlach | 317/235 |
| 3,440,501 | 4/1969 | Piccone et al. | 317/235 |
| 3,486,088 | 12/1969 | Gray et al. | 317/235 |

OTHER REFERENCES

Somos et al., Proc. IEEE, Vol. 55, No. 8, " Behavior of Thyristors Under Transient Conditions," pp. 1306– 1311 (Aug. 1967)

*Primary Examiner*—John W. Huckert
*Assistant Examiner*—William D. Larkins
*Attorneys*—J. Wesley Haubner, Albert S. Richardson, Jr., Frank L. Neuhauser, Oscar B. Waddell and Melvin M. Goldenberg

ABSTRACT: This thyristor utilizes the emitter gate heretofore described and claimed in our copending U.S. Pat. application Ser. No. 602,837, filed Dec. 19, 1966, and assigned to the assignee of the present invention (now Pat. No. 3,489,962). According to that disclosure, part of an electrode-less auxiliary region in one end layer (the emitter) of A PNPN semiconductor body is exposed to suitable triggering means for turning on the device According to the present improvement, an island of electroconductive material remote from the cathode and separate from the triggering means is disposed on another part of the auxiliary region between said exposed part and a laterally adjacent main region of the emitter, and the other part is connected to the main region in a manner to ensure a high turn-on *di/dt* capability when the referenced device is triggered by a "soft" gate drive.

PATENTED NOV 23 1971 3,622,845

INVENTORS:
JAMES E. MCINTYRE,
DANTE E. PICCONE,
ISTVAN SOMOS,

BY Albert S. Richardson Jr.
ATTORNEY

SCR WITH AMPLIFIED EMITTER GATE

This invention relates generally to solid-state electric current switches of the multilayer semiconductor type, and more particularly it relates to a high-power silicon controlled rectifier (known generally as a thyristor or SCR) having improved switching characteristics.

Typically an SCR comprises a thin, broad area disclike body having four distinct layers of semiconductor material (silicon), with contiguous layers being of different conductivity types to form three back-to-back PN (rectifying) junctions in series. A pair of main current-carrying electrodes (anode and cathode) are provided in low-resistance (ohmic) contact with the outer surfaces of the respective end layers of the silicon body, and for triggering conduction between these electrodes the body is normally equipped with at least one control electrode (gate contact). To complete the device the silicon body is sealed in an insulating housing, and it can be externally connected to associated electric power and control circuits by means of its main and control electrodes.

When connected in series with a load impedance and a source of forward bias voltage, an SCR will ordinarily not conduct current between its anode and cathode until a small gate current of suitable magnitude and duration is supplied to the control electrode, whereupon it abruptly switches from a high impedance to a very low impedance, forward conducting (turned on) state. Subsequently the device reverts to its blocking (turned off) state in response to load current being reduced below a given holding level.

The SCR's of primary interest herein are those having relatively high-power ratings: when off they can successfully block high reverse voltages of the order of 1,800 Peak Reverse Volts or more; when on they can normally conduct high forward currents of the order of 50 to 1,000 Amperes (average). Of interest also are high-frequency (e.g., 3,000 Hz.) SCR's of lesser voltage ratings (e.g., 300 PRV). These high steady state ratings can be obtained by using semiconductor bodies having broad conducting areas and comparatively thick internal (base) layers. But due to their large size, such devices may have switching characteristics that are not entirely satisfactory for many practical applications thereof.

As a general rule, desirable turn-on characteristics of a high-power SCR comprise: (1) a high *di/dt* rating; (2) a low turn-on voltage; and (3) a short delay time. In other words, when the SCR is triggered, as much of its active area as possible should begin conducting as quickly as possible at the lowest possible minimum forward bias voltage. In practice this desired result can now be achieved with surprising success by utilizing the unique emitter gate construction that we previously disclosed in the above-referenced patent application. As is explained therein, the turn-on *di/dt* capability of the "positive" gate species of our prior device is a function of gate drive, and it has been necessary to use a "hard" gate drive to ensure that this parameter is as high as is sometimes desired. A hard gate drive is one that will excite the gating region of the SCR with substantially more (e.g., five to 10 times greater) than the critical or minimum amount of energy which is just sufficient to trigger the device. Hard gate drives are generally more costly to make and less efficient to operate than weak or soft gate drives. Accordingly, a general objective of the present invention is to provide further improvements in a high-current, high-voltage SCR, whereby the desirable switching characteristics can be obtained without overdriving the gate.

Another objective of our invention is to provide a "universal" controlled rectifier in which all of the above-reviewed attributes are realized whether the device is supplied with trigger signals from a soft gate drive or from a hard gate drive.

In carrying out the invention in one form, we utilize an SCR built in accordance with the teaching of our above-referenced patent application, and we provide certain additional features that will now be summarized. We provide in the auxiliary region of the emitter, in addition to the exposed part of this region where the control electrode is connected, a second part which is disposed between the exposed part and a laterally adjacent border of the emitter's main region. A portion of the surface of the second part is covered by an island of electroconductive material remote from the cathode of the device and spaced apart from said border. When the anode and the cathode of this device are connected in series with an external source of forward bias voltage and a load, and the control electrode is energized by a soft positive gate drive, the device will start to turn on at an area of the semiconductor body directly under the aforesaid island. We construct and arrange the various parts of the emitter so that load current that flows through the initially conducting path in the device is able to serve as an amplified trigger signal for another larger area of the semiconductor body subtending the cathode along the border of the main region of the emitter.

Our invention will be better understood and its various objects and advantages will be more fully appreciated from the following description taken in conjunction with the accompanying drawing in which.

Figure 1:
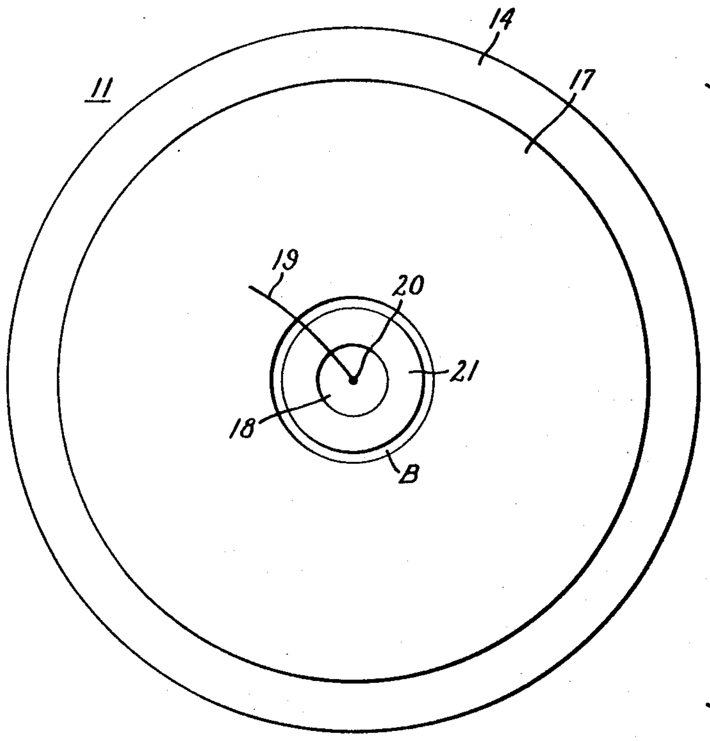
FIG. 1 is a plan view of a semiconductor switching device constructed in accordance with the presently preferred form of our invention.
Figure 2:
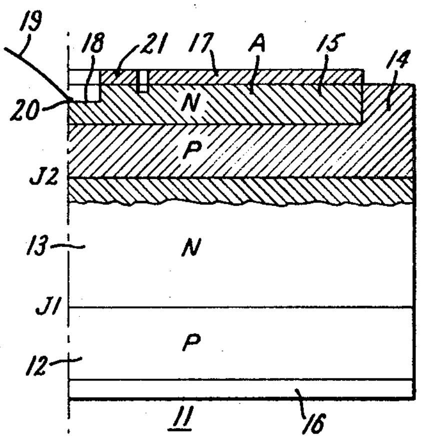
FIG. 2 is an elevational view, partly in section, of the right half of the device shown in FIG. 1.
Figure 2A:
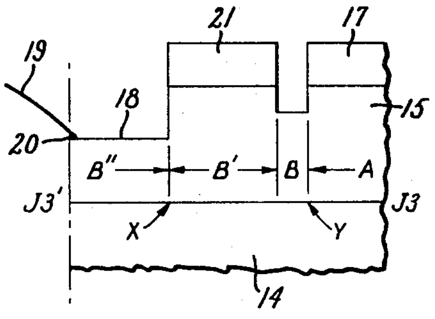
Figure 3:
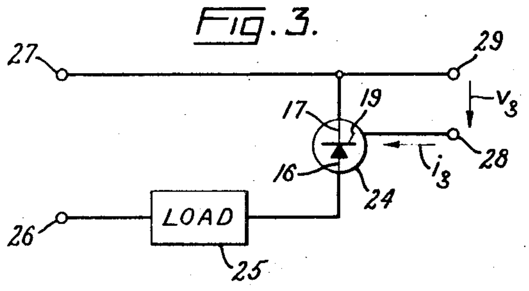
Figure 5:
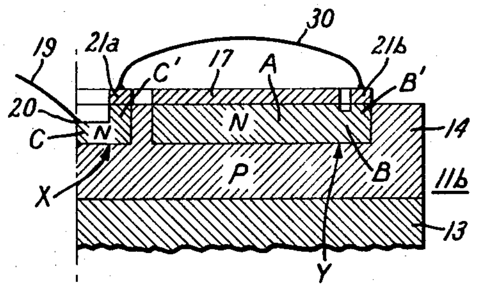
Figure 4:
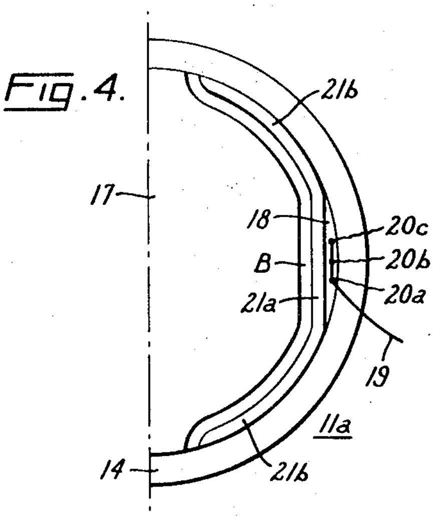

FIG. 2*a* is a simplified enlarged view of the auxiliary region of the emitter of the device shown in FIG. 2;

FIG. 3 is a schematic diagram of this device connected in an electric circuit;

FIG. 4 is a partial plan view, similar to FIG. 1, of a modified form of the invention; and FIG. 5 is a partial cross-sectional view, similar to FIG. 2, of a device embodying another alternative form of the invention.

Referring now to FIGS. 1 and 2, we have shown a disclike asymmetrically conductive body 11 comprising four layers or zones 12, 13, 14, and 15 of semiconductor material (preferably silicon) arranged in succession between a pair of spaced-apart metallic main electrodes 16 and 17. Contiguous layers of the body 11 are of different conductivity types, and their interface boundaries thereby form rectifying junctions J1, J2, and J3, respectively. More particularly, as is shown in FIG. 2, the lower end layer 12 of the body 11 is of P-type conductivity, the contiguous internal layer 13 is of N-type conductivity, the next intermediate layer 14 is of P-type conductivity, and the upper end layer 15 is of N-type conductivity. The latter end layer will be herein referred to as the emitter. On of the main electrodes 16 is ohmically connected to the P-type end layer 12 and is referred to as an anode of the illustrated device, while the companion main electrode 17 is similarly connected to the opposite N-type end layer or emitter 15 and is referred to as a cathode.

Although in the drawings its thickness has been exaggerated for the sake of clarity, the PNPN body 11 is really quite thin, e.g., approximately 20 mils. On the other hand, the diameter of the body typically is relatively large, e.g., 1.5 inches. Thus each of the three rectifying junctions J1, J2, and J3 that are serially disposed between anode 16 and cathode 17 has a broad area. While the various junctions within the illustrated device have been depicted in FIG. 2 by solid horizontal lines, those skilled in the art will understand that actually these boundaries are not such discretely definable plane surfaces.

The above-described device can be constructed by any of a number of different techniques that are well known in the semiconductor art today. For example, a known diffusion process can be used to form the two P-type layers 12 and 14 in a thin wafer of N-type bulk material comprising phosphorous-doped silicon having a resistivity of approximately 60 ohm-centimeters. During this process sufficient acceptor impurities (e.g., gallium) are diffused into opposite sides of the wafer to convert about 4 mils of the bulk material to P-type conductivity, the surface concentration of gallium being $10^{19}$ atoms per cubic centimeter. Subsequently, by alloying a thin disk of 99.5 percent gold and 0.5 percent antimony to the P-type layer 14 of the silicon body, an N-type emitter and adjoining cathode are simultaneously formed. This step of the process can be so controlled that the donor impurities (antimony) reconvert a portion 15 of the layer 14 to N-type conductivity for a depth of approximately 2 mils, the regrown layer 15 having a substantially uniform concentration of $10^{18}$ antimony atoms per cubic centimeter. The remainder of the gold-antimony disk comprises the cathode 17 which consequently is in broad area ohmic contact with the emitter layer 15. During the same alloying step, a broad area ohmic junction can be obtained between the P-type end layer 12 of the silicon body and a conforming layer 16 of aluminum foil or the like, which layer herein is referred to as the anode of the device. In practice a thicker substrate of tungsten or molybdenum or the like may be bonded to the bottom surface of this anode. In lieu of alloying, another diffusion step (using donor impurities such as phosphorous) or alternatively an epitaxial process could be used to form the emitter 15 if desired.

In accordance with our prior disclosure, a predetermined one of the semiconductor end layers of the above-described device is divided into two juxtaposed regions that are disposed laterally adjacent to each other. In FIGS. 1 and 2 the emitter 15 has been so divided. One of these regions, hereinafter referred to as the main region A, has a major face of relatively broad area (e.g., over 1 square inch) in ohmic contact with the cathode 17; this region is the only part of the emitter that touches the cathode. The laterally adjacent auxiliary region, which is located inboard with respect to the main region and preferably centered on the axis of the semiconductor body 11 as shown, is free of cathode connections. By "inboard" we mean that the auxiliary region is located within the outer perimeter of the main region A, i.e., it is completely surrounded by the main region. The device is triggered (turned on) by means impinging directly on an exposed minor face 18 of a relatively thin part B'' of the auxiliary region in the emitter 15.

Any suitable triggering means can be used. For example, the exposed face 18 would be flooded with electromagnetic radiation, more particularly infrared light. At present, however, we prefer and have illustrated triggering means that comprises a metallic control electrode 19 joined to a limited area of the exposed face 18 by at least one nonohmic contact, by which we mean a connection that is intended to behave like a nonlinear resistor having initially a relatively high resistance that becomes low as the applied voltage increases. Preferably the control electrode is an aluminum wire welded to the center of the auxiliary region to form therewith a metal-to-semiconductor contact 20 which is set back from the perimeter or edge of the exposed face 18.

Part B'' of the auxiliary region is so constructed and arranged that its lateral resistance is relatively high. While this result can be obtained by altering the electrical properties of B'' with respect to the main region A of the emitter 15, we prefer to obtain it by reducing its thickness. (The "thickness" of the region refers to its dimension parallel to the direction of main current flow between the anode 16 and the cathode 17 of the device, and "lateral" refers to a direction oriented perpendicular thereto.) Preferably the thinner part B'' of the auxiliary region is formed by etching or abrading a concentric circular portion of the original exterior surface of the emitter to remove an appreciable amount of semiconductor material comprising this layer, whereby the remaining material is disposed under an etched-out recess and its thickness consequently is reduced. As can be clearly seen in FIG. 2, the exposed face 18 of the material that remains under this removed portion of emitter 15 is depressed but still generally parallel with respect to the plane of the major face of the adjacent main region A.

In accordance with our present invention, the cathode-free auxiliary region of the emitter 15 of the device 11 is provided with another part located between the previously described part B'' and a border of the main region A. As is best seen in FIGS. 1 and **2*a*, the other part actually comprises two concentric annular subparts B and B'. Part B, which in effect comprises an additional auxiliary region, extends laterally from the surrounding inner border of the main region A, while part B' laterally adjoins and circumscribes the central circular part B''. Thus the part B' separates B'' from B. In intimate contact with only the intermediate part B' is an overlaying pilot contact or island 21 of electroconductive material (e.g., gold or aluminum) which preferably covers the whole annular surface of B'. This island 21 is remote from the cathode 17, and it is separate from the gate contact 20 (i.e., the island 21** does not overlay the part B'' on which the triggering means impinges).

In manufacturing the device 11, the annular part B' of the emitter 15 and its overlaying island 21 can be formed at the same time the main region A and overlaying cathode 17 are being formed, and the island 21 can then be isolated from the cathode by an etching process or the like. The auxiliary region B is so constructed and arranged that the resistance across the gap between the island 21 and the cathode 17 is higher than that of any adjacent section of the main region A having a corresponding lateral dimension. If necessary to ensure the requisite lateral resistance of part B, its thickness can be reduced by etching or abrading an annular channel in the original exterior surface thereof. For reasons that will soon be explained, we do not want the lateral resistance of B to be as high as that of B'', and this result can readily be obtained by appropriately controlling and optimizing the selection of four parameters; the diameter of part B'', the width of part B', the spacing between B' and A, and the thickness of B relative to B''. As is indicated most clearly in FIG. **2*a***, part B'' has been made thinner than part B.

To complete a commercially practical component, the device shown in FIGS. 1 and 2 can be mounted in an hermetically sealed insulating housing of any suitable design, with its electrodes 16, 17, and 19 being respectively connected to separate terminal members of the housing which members in turn are adapted to be connected to external electric circuits in which the device will be used. FIG. 3 is a schematic illustration of the complete semiconductor controlled rectifier, identified by the reference number 24, connected in series with a load 25 between a pair of electric power input or source terminals 26 and 27. The illustrated rectifier 24 is symbolic of the previously described high-power device 11. To turn on this component, a trigger signal is applied to its control electrode or gate 19 by a suitable source of energy represented in FIG. 3 by a pair of terminals 28 and 29 which are adapted to be energized by a unipolarity gate voltage $V_g$. Any one of a variety of known gate drive circuits can be used for this purpose: see for example Chapter 5, especially pages 205—47, of SEMICONDUCTOR CONTROLLED RECTIFIERS by F. E. Gentry et al. (Prentice-Hall, Inc., Englewood Cliffs, N.J. 1964). The magnitude of the trigger signal depends on the parameters of the circuit actually used, but in any event it will be within a specified range. The negative terminal 29 of the gate drive is shown connected to the cathode 17 of the controlled rectifier 24, although if desired it could alternatively be connected to the island 21. The direction of conventional current flow is into the gate as indicated by the arrow, and hereinafter we will refer to this as positive gate current $i_g$. Alternatively, the device could be turned on by gate current flowing in the opposite or negative direction, which may be advantageous in some applications of our invention. (Although not shown in FIG. 3, a snubber circuit, comprising resistance and capacitance in series, is ordinarily connected in parallel with the controlled rectifier 24, and *di/dt* limiting inductance is ordinarily connected in series therewith.)

When the controlled rectifier 24 is subjected to positive gate current and a forward bias voltage (the potential of the source terminal 26 being positive with respect to terminal 27), cathode current can be sufficiently increased to cause the controlled rectifier to change abruptly from a blocking or off state to a main current conducting state, whereupon the gate 19 loses control until anode current in the rectifier is subsequently reduced below the holding current level and the device reverts to its forward blocking state. By utilizing our present invention, this turn-on process is accomplished without sacrificing the advantageous switching characteristics of our original emitter gate device but, unlike that device, a high *di/dt* capability is assured regardless of whether a hard gate drive or a soft gate drive is used. By soft gate drive we mean one that supplies a trigger signal such that a device of the size and power rating hereinbefore described can be successfully turned on or fired at a gate current level as low as approximately 0.1 amp.

A distinguishing characteristic of our invention is that during the turn-on process of the device 11 main current conduction starts under the island 21, and the initially conducting path includes a lateral portion of the semiconductor body interconnecting the island 21 and the cathode 17. We have constructed and arranged the emitter 15 so that main current flowing in this lateral segment of the initially conducting path is encouraged to cross an appreciable length of the border of the emitter's main region A. In the preferred embodiment of our invention, the lateral path that interconnects the island 21 and cathode 17 for initially conducting main current when the device 11 is triggered comprises the annular region or part B of the emitter 15. This part extends laterally from the inner border of the main region A to part B′ of the inboard auxiliary region.

In accordance with the "field-initiated" principle, which is the subject matter of U.S. Pat. No. 3,408,545—DeCecco, Piccone and Somos, a significant fraction of the main current traversing the lateral segment of the initially conducting path of the device 11 will flow across the rectifying junction between the main region A and the contiguous P-type layer 14 of the semiconductor body, thereby bypassing the lateral segment and acting as a second, peremptory trigger signal for a broad area portion of the body subtending the cathode 17 in the vicinity of the aforesaid lengthy border of the main region A. This will expedite the spread of current and ensure a high *di/dt* rating even though a relatively weak trigger signal was initially supplied by the appurtenant control circuit. Once the main portion of the device is turned on by the amplified gate current which is derived from the external power circuit, conduction in the initial path is extinguished.

With reference now to FIG. 2*a*, we will offer a more complete explanation of the turn-on process that probably takes place in this device. Upon applying positive excitation to the gate 19, hole current begins in the forward direction across the PN junction between the internal P-layer 14 of the semiconductor body and part B′ of the auxiliary region in the emitter 15, and electrons are contemporaneously injected into the layer 14 from part B′. All of this occurs near the perimeter "X" of the adjoining exposed part B″ of the original auxiliary region, and consequently main current conduction will start under the annular island 21 along at least a portion of this perimeter. The length of the perimeter X that starts conducting is a function of the magnitude of the initially applied trigger signal. (For a fuller understanding of this first step of the turn-on process, see our above-referenced patent application.) To reach the cathode 17, main current must initially pass laterally through the adjacent part B of the auxiliary region, and as a result a transverse voltage field is developed in this part. This effects main current conduction in a parallel path comprising the adjoining P-layer 14 and the PN junction between it and the main region A of the emitter 15. The parallel path crosses the latter junction near the inner periphery or border of the annular main region A, and therefore a second, amplified triggering action occurs here (at "Y" in FIG. 2*a*). Main current will now transfer abruptly from the initially conducting interlayer path under line "X" to a broader area portion of the device under line "Y" from where it can spread radially across the whole area of the main region A. By disposing the intermediate part B′ of the auxiliary region and its overlaying island 21 in substantially uniformly spaced relation to the adjacent border of the main region A, the current that initially traverses part B is encouraged to spread out along substantially the full length of this border, whereby the second turn-on line is appreciably longer than the initial line.

It will be apparent that the second step of the turn-on process ensures a high *di/dt* rating even if the area of the initially conducting path were small due to a soft gate drive being used. The initially turned on line will be longer and the same device will have an even higher *di/dt* rating if a hard gate drive is used. In order to avoid the possibility that a hard gate drive might bypass X and initially trigger the device directly at Y, in which event the benefits of firing the device by a main current derived trigger signal would be lost, we make the lateral resistance of part B (as measured between the island 21 and the cathode 17) lower than the lateral resistance of part B″ (as measured between the gate contact 20 and the island 21). By selecting the proper resistance across B, we can minimize the initial injection of electrons near Y when the external trigger signal is applied to the control electrode 19. Due to its low electron injection, the trigger delay time at line Y will be greater than at line X, whereby B″ is more sensitive than B and the device in fact always turns on first at X for any magnitude of gate current $i_g$ within a specified design range. As was previously mentioned, this result can be readily obtained by appropriate geometry controls. When so made, our improved device will perform satisfactory when excited by gate current whose magnitude is within a predetermined range, which current can be supplied by either soft or hard gate drives. The latter is preferred where the device 11 is required to operate directly in parallel with one or more duplicate devices. On the other hand, for most other applications the same device is fully compatible with soft gate drives which are commonly preferred.

The form in which our invention is practiced can vary from the one that has been particularly described above. FIG. 4 illustrates an alternative embodiment. This figure is intended to depict a semiconductor switching device 11*a* which is essentially the same as the device shown in FIG. 1 except for the cathode-free auxiliary region being relocated outboard or peripherally in the emitter 15 of the semiconductor body. The first part B″ of the auxiliary region comprises a relatively thin peripheral segment or lip of the emitter, and the control electrode 19 is connected to the exposed face 18 of this lip at three separate points of nonohmic contact 20*a*, 20*b*, and 20*c*. These limited areas of contact are substantially equidistantly spaced from a chordal section 21*a* of the electroconductive island that covers the laterally adjoining part B′ of the auxiliary region. As before, part B′ and its overlaying island is disposed between the exposed part B″ and an adjacent border of the main region A of the emitter 15, and in order to increase the length of this border the island includes arcuate sections 21*b* extending from opposite ends of the chordal section 21*a*. As is clearly shown in FIG. 4, the island 21*a*, 21*b* is remote from the cathode 17, and there is an additional auxiliary region or part B of the emitter 15 that extends laterally from the outer border of the main region under the cathode 17 to the adjoining part B′ under the island 21*a*, 21*b*. When the device 11*a* is triggered, it will turn on in the same manner as the previously described device 11. The arcuate sections 21*b* of the electroconductive island enable main current to spread out laterally from the initially turned on area under the chordal section 21*a*.

Several possible alternatives of the FIG. 4 embodiment of our invention will now be described. The left half of the device 11*a* could be a mirror image of the right half, in which case the device would have two separate, diametrically opposite auxiliary regions with two duplicate control electrodes which could be energized simultaneously or alternately. On the other hand, the auxiliary region in the illustrated device could be arranged to circumscribe the main region of the emitter by extending the adjoining parts B and B′, as well as the arcuate sections 21*b* of the associated island of electroconductive material, around the whole perimeter of the emitter. If a ring gate were desired, part B″ of the auxiliary region could be similarly extended so that its exposed face 18 and the area thereof on which the triggering means impinges are annular, or a plurality of duplicate parts B″ could be spaced around the periphery of the auxiliary region.

Instead of a uniform spacing between the outer periphery or border of the main region A (under the cathode 17) and the oppositely disposed part B′ (under the island 21*a*, 21*b*) of the emitter, a variable spacing could be used, with the spacing being maximum adjacent to the chordal section 21*a* which is located nearest the gate contacts 20*a*–20*c*. Thus the arcuate sections 21*b* would be closer than the chordal section 21*a* to the cathode 17, and upon triggering the device the main current that initially flows under the chordal section 21*a* would prefer to follow a lateral path comprising the electroconductive island and the distal sections of part B of the emitter where the gaps between 21*b* and the cathode 17 are reduced. This encourages the second step of the turn-on process to take place in one or more areas of the semiconductor body relatively far removed from the first interlayer path of conduction. Since the portions of the device that are triggered by the amplified gate current are remote from the initially conducting interlayer path under the chordal section 21*a*, they are relatively cool and can safely endure a higher *di/dt*, and the initial path benefits by its thermal isolation from those remotely located portions.

Regardless of whether uniform or variable spacing is used, those regions of part B′ which are covered by the arcuate sections 21*b* of the overlaying island could be physically separated from the proximal region of this part, with the chordal section 21*a* of the island being conductively linked to the separate arcuate sections 21*b* by an outside electrical connection such as an aluminum wire or a metallic band deposited on an emerging surface of the internal P-type layer of the semiconductor body. Thus the previously described three part auxiliary region would be replaced by an equivalent plurality of spaced-apart but interdependent two part auxiliary regions. FIG. 5 illustrates another form of this particular alternative. The emitter of the device 11*b* shown in FIG. 5 comprises three juxtaposed regions. An annular main region A is disposed in relatively broad area ohmic contact with the cathode 17. A circular auxiliary region CC′ is located inboard with respect to the main region A, and an annular auxiliary region BB′ is located outboard with respect thereto; both auxiliary regions are free of the cathode 17. The first auxiliary region comprises a relatively thin concentric part C having an exposed minor face on which the triggering means centrally impinges, and this part is circumscribed by a laterally adjoining annular part C′ in ohmic contact with an overlaying pilot contact or island 21*a* of electroconductive material. The latter part of the original auxiliary region is spaced apart from the adjacent main region A by a gap which may include semiconductor material of either N-type or, as shown, P-type conductivity; in any case the island 21*a* is remote from the cathode 17 and there is a predetermined lateral resistance across the intervening surface of the semiconductor body. The additional auxiliary region comprises an annular part B which laterally adjoins the outer border of the main region A and which in turn is circumscribed by an associated part B′ in ohmic contact with another overlaying ringlike island 21*b* of electroconductive material remote from the cathode 17. The annular part B is constructed and arranged so that its lateral resistance, as measured between the island 21*b* and the cathode 17, is the same as or lower than the aforesaid predetermined resistance. Although the two auxiliary regions in the FIG. 5 embodiment of our invention are physically remote from each other, we interconnect their respective islands 21*a* and 21*b* by means of a low-resistance metallic conductor such as the illustrated wire 30 or, alternatively, a strip of gold or aluminum or the like on a surface of the semiconductor body spaced from the cathode.

In the manner previously described, applying a positive trigger signal to the control electrode 19 of the device 11*b* causes main current conduction to start under the island 21*a* around the perimeter X of the central part C of the original auxiliary region. Between part C′ of this region and the outer border of the main region A, main current is initially conducted by a path provided by the island 21*a*, the conductor 30, the island 21*b*, and the additional auxiliary region BB′. As a result, the second, amplified triggering action will take place in a broad area portion of the semiconductor body subtending the outer edge of the cathode 17 around the perimeter Y of the main region A.

Still other modifications of our invention will be readily apparent. For example, the inner border of the main emitter region of the device shown in FIG. 1 could be lengthened by giving it a generally star-shaped configuration, with correspondingly shaped fingers of the island 21 extending radially from an annular hub to form patterns like those disclosed in copending U.S. Pat. application Ser. No. 809,076—Moyson, filed on Mar. 21, 1969 and assigned to the assignee of the present invention. The island 21 shown in FIGS. 1 and 2, or the island 21*a* shown in FIG. 4 or FIG. 5, could be connected by means of a metallic conductor to another gate contact located on a remote part of the same semiconductor switching device or on an additional device, in which event the other gate contact could comprise a conventional "P-gate" or could be constructed in accordance with our present or prior teachings or the teachings of the above-cited DeCecco et al. patent. The emitter 15 and contiguous P-type layer 14 of the semiconductor body could be shorted by the cathode 17 if desired. It should be understood, therefore, that we do not wish to be limited to the exact details of construction of the illustrated embodiments of our invention.

What we claim as new and desire to secure by Letters Patent of the United States is:

1. An improved semiconductor switching device comprising four layers of semiconductor material arranged in succession between first and second main current carrying electrodes, with contiguous layers being of different conductivity types so that rectifying junctions are formed therebetween, a first one of the opposite end layers of semiconductor material comprising juxtaposed main and auxiliary regions, the former being disposed in relatively broad area contact with the first main electrode and the latter being free of that electrode, said device being adapted to be triggered from a nonconducting state to a main current conducting state by means impinging on a relatively thin part of an auxiliary region of said first end layer, wherein the improvement comprises means including electroconductive material in contact with another part of said auxiliary region for providing between said auxiliary region and a predetermined border of said main region a path that initially conducts main current when the device is triggered, said electroconductive material being separate from said triggering means and remote from said first main electrode, said path including an additional auxiliary region of said first end layer extending laterally from said predetermined border of said main region and being free of said first main electrode, said additional auxiliary region being thicker than said relatively thin part of said first-mentioned auxiliary region.

2. An improved semiconductor switching device comprising a semiconductor body having four layers arranged in succession between first and second main current carrying electrodes, with contiguous layers being of different conductivity types so that rectifying junctions are formed therebetween, a first one of the opposite end layers of said body comprising juxtaposed main and auxiliary regions, the former being disposed in relatively broad area contact with the first main electrode and the latter being free of that electrode, said device being adapted to be triggered from a nonconducting state to a main current conducting state by means impinging directly on a limited surface area of a predetermined part of an auxiliary region of said first end layer, said triggering means comprising a trigger signal whose magnitude is within a predetermined range, wherein the improvement comprises:

a. said auxiliary region having another part laterally adjoining said predetermined part and located between the latter and a border of said main region,
b. an island of electroconductive material overlaying said other part remote from said first main electrode; and c. said predetermined part of the auxiliary region being thinner than said other part and having a lateral resistance, measured between said island and the center of said limited area, higher than the resistance between said first main electrode and said island so that, when the device is triggered by a trigger signal of any magnitude in said predetermined range, i. the trigger delay time of the rectifying junction between said other part and a contiguous intermediate layer of said body is shorter than that of the rectifying junction between said main region and said intermediate layer, ii. main current always starts flowing in a path of relatively small area under said island and is encouraged to cross an appreciable length of the border of said main region, and iii. a significant fraction of initial main current will flow through the rectifying junction between said main region and said intermediate layer, thereby acting as a peremptory trigger for the portion of said body subtending said first main electrode.

3. An improved semiconductor switching device comprising four layers of semiconductor material arranged in succession between first and second main current carrying electrodes, with contiguous layers being of different conductivity types so that rectifying junctions are formed therebetween, a first one of the opposite end layers of semiconductor material comprising laterally adjoining main and auxiliary regions, the former being disposed in relatively broad area contact with the first main electrode and the latter being free of that electrode, said device being adapted to be triggered from a nonconducting state to a main current conducting state by means impinging on said auxiliary region of said first end layer, said triggering means comprising a trigger signal whose magnitude is within a predetermined range, wherein the improvement comprises said auxiliary region having juxtaposed first, second, and third parts:

a. said first part extending laterally from a border of said main region, b. said second part being disposed laterally adjacent to said first part in spaced relation to said main region and being the only part of said auxiliary region on which said triggering means impinges;

c. said third part being located between said first and second parts; and d. an island of electroconductive material covering said third part of said auxiliary region, said island being separate from said second part and remote from said first main electrode;

e. said first part of the auxiliary region being thinner than the bordering portions of said third part and of said main region, respectively, and said second part being thinner than any bordering portion of said third part and being so constructed and arranged in relation to said first and third parts that its lateral resistance, measured between said electroconductive material and the center of the area where said triggering means impinges, is higher than the resistance between said first main electrode and said electroconductive material, whereby, upon triggering of the device, main current conduction will always start in a portion thereof under said electroconductive material for any magnitude of trigger signal within said predetermined range.

4. The device of claim 3 wherein said first and second parts of the auxiliary region are disposed under etched-out recesses in the original exterior surface of said first end layer.

5. An improved semiconductor switching device comprising a semiconductor body having four layers arranged in succession between first and second main current carrying electrodes, with contiguous layers being of different conductivity types so that rectifying junctions are formed therebetween, a first one of the opposite end layers of said body comprising juxtaposed main and auxiliary regions, the former being disposed in relatively broad area contact with the first main electrode and the latter being free of that electrode, said device being adapted to be triggered from a nonconducting state to a main current conducting state by means impinging on the surface of a predetermined part of a first auxiliary region of said first end layer, said triggering means comprising a trigger signal whose magnitude is within a predetermined range, wherein the improvement comprises:

a. a first island of electroconductive material overlaying another part of said first auxiliary region, said other part being spaced from said main region and said first island being remote from said first main electrode;

b. a second auxiliary region in said first end layer extending laterally from a border of said main region and being free of said first main electrode;

c. a second island of electroconductive material intimately connected to a part of said second auxiliary region spaced from said border, said second island being remote from said first main electrode;

d. means for conductively interconnecting said first and second islands; and e. said islands and said auxiliary regions being so constructed and arranged that the lateral resistance of said predetermined part of said first auxiliary region is higher than the resistance between said first main electrode and said islands, whereby, when the device is triggered by a trigger signal of any magnitude in said predetermined range, i. the trigger delay time of the rectifying junction between said other part of the first auxiliary region and a contiguous intermediate layer of said body is shorter than that of the rectifying junction between said main region and said intermediate layer, ii. main current always starts in a path of relatively small area under said first island, flows through said first and second islands and their interconnecting means, and crosses an appreciable length of said border of the main region, and iii. a significant fraction of initial main current will flow through the rectifying junction between said main region and said intermediate layer, thereby acting as a peremptory trigger for the portion of said body subtending said first main electrode.

6. The device of claim 5 in which the first auxiliary region is located inboard with respect to said main region and said second auxiliary region is located outboard with respect thereto.

* * * * *